(12) United States Patent
Katou

(10) Patent No.: US 8,067,790 B2
(45) Date of Patent: Nov. 29, 2011

(54) SEMICONDUCTOR DEVICE WITH LESS POWER SUPPLY NOISE

(75) Inventor: Tetsuya Katou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 397 days.

(21) Appl. No.: 12/323,533

(22) Filed: Nov. 26, 2008

(65) Prior Publication Data
US 2009/0140309 A1   Jun. 4, 2009

(30) Foreign Application Priority Data
Nov. 30, 2007   (JP) .................................. 2007-310453

(51) Int. Cl.
*H01L 23/52* (2006.01)
(52) U.S. Cl. .................................. 257/207; 257/E27.107
(58) Field of Classification Search .................. 257/207, 257/E27.107
See application file for complete search history.

(56) References Cited

U.S. PATENT DOCUMENTS

| 6,239,614 | B1 * | 5/2001 | Morikawa ........................ 326/39 |
| 6,483,374 | B1 * | 11/2002 | Mizuno et al. ................. 327/534 |
| 2003/0230769 | A1 * | 12/2003 | Tsutsumi et al. ............. 257/207 |
| 2007/0074134 | A1 | 3/2007 | Katoh |
| 2007/0252217 | A1 * | 11/2007 | Oki ............................... 257/369 |

FOREIGN PATENT DOCUMENTS

JP    2007-95787    4/2007

* cited by examiner

*Primary Examiner* — Kenneth Parker
*Assistant Examiner* — Paul Budd
(74) *Attorney, Agent, or Firm* — Young & Thompson

(57) ABSTRACT

A semiconductor device includes a first power supply line; a second power supply line; a first cell arrangement area in which a first cell is arranged; and a switch area in which a switching transistor and a decoupling capacitance are arranged. The first cell is provided in a first well of a first conductive type, the switching transistor is provided in a second well of the first conductive type, and the decoupling capacitance is provided in a separation area of a second conductive type to separate the first well and the second well from each other. The switching transistor connects the first power supply line and the second power supply line in response to a control signal, the first cell operates with power supplied from the second power supply line, and the decoupling capacitance is connected with the first power supply line.

13 Claims, 9 Drawing Sheets

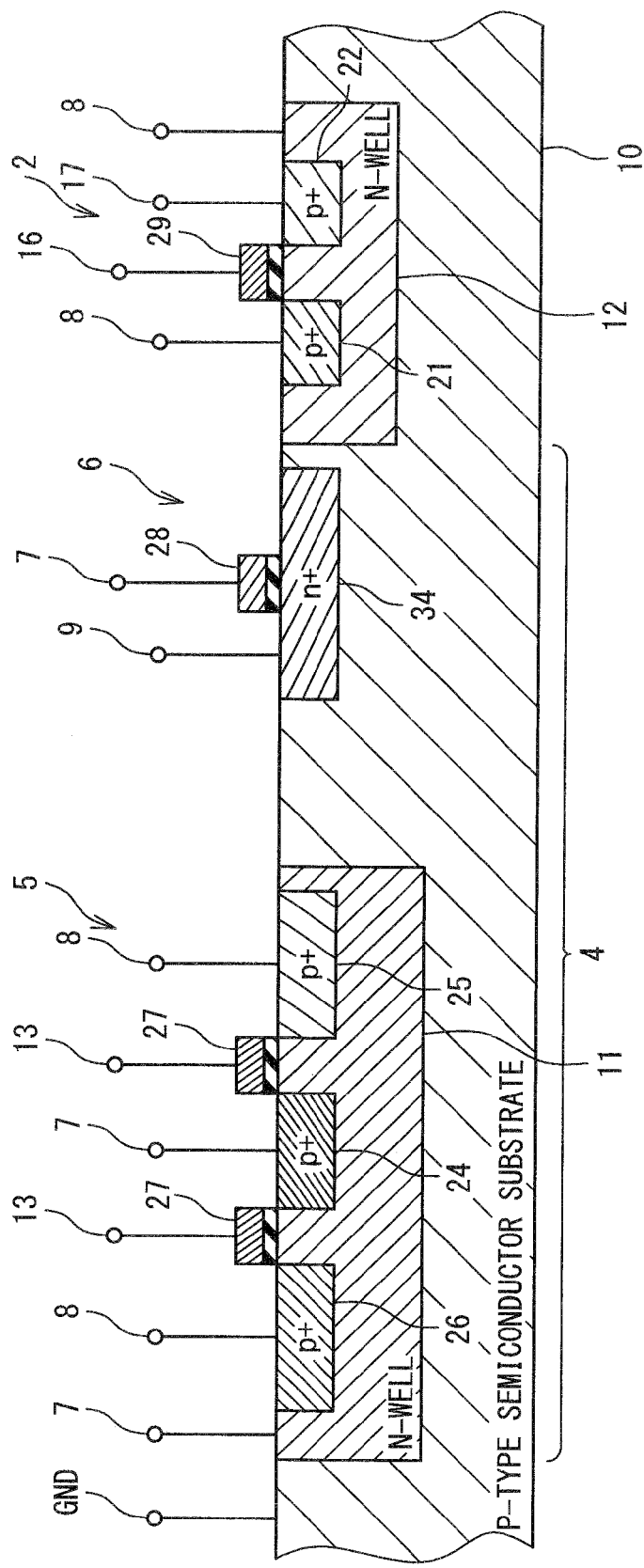

SEMICONDUCTOR DEVICE WITH LESS POWER SUPPLY NOISE

INCORPORATION BY REFERENCE

This patent application claims priority on convention based on Japanese Patent Application (2007-310453). The disclosure thereof is incorporated herein by reference.

BACKGROUND OF THE INVENTION

1. Field of the Invention

The present invention relates to a semiconductor device.

2. Description of Related Art

A leakage current increasing with advancement of a technique for forming fine patterns in a semiconductor device is considered as a problem. The leakage current is a current flowing when the semiconductor device does not operate, and this unnecessarily leaking leakage current occupies a large proportion in a total of power consumption of the semiconductor device.

A semiconductor device is known in Japanese Patent Application Publication (JP-P2007-95787A: related art 1) in which an increase of this power consumption is suppressed by having two operation states of a standby state (a state that supply of power to a non-operation section is temporarily stopped) and a normal operation state (a state that a normal operation is performed). In the semiconductor device, the state thereof shifts from the normal operation state to the standby state by stopping the power supply to a region.

FIG. 1 is a circuit diagram of a semiconductor device 100 shown in the related art 1. Referring to FIG. 1, the semiconductor device 100 includes a controlled function block 101 and a power supply switch 102. In addition, the semiconductor device 100 includes a function block in which a control of power supply is not performed (hereinafter to be referred to as a non-controlled function block). The controlled function block 101 is a function block in which the power supply is stopped in the standby state. The power supply switch 102 connects the controlled function block 101 to a power supply wire Vdd in response to a control signal.

FIG. 2 is a layout diagram showing the semiconductor device 100 including the power supply switch 102 and the controlled function block 101. In the layout diagram of the controlled function block 101, a switch cell 107 and a function cell 108 are shown. The switch cell 107 is configured to include a first well 121. A switching transistor 113 is formed in the first well 121. In addition, the function cell 108 includes a second well 122. The first well 121 and the second well 122 are electrically isolated from each other A metal interconnection 116 is formed in a region of the first well 121. As described above, a power supply voltage VDD is supplied to the metal interconnection 116 via a first via contact (not shown).

When the power supply switch 102 is activated to connect the controlled function block 101 to the power supply line, a rush current (a current rapidly flowing in starting-up a circuit) sometimes flows in the power supply line Vddv and the power supply line Vdd. When the rush current flows, a counter electromotive force due to inductance components of a bonding wire and a long interconnection line is generated depending on a rate of change of the rush current. The counter electromotive force generates power supply noise on the power supply line, and the power supply noise continues until a power supply IC externally provided to the semiconductor device 100 responds to the rush current to sufficiently supply the power supply voltage. A malfunction of the controlled function block sometimes occurs due to the power supply noise. A technique for reducing the power supply noise by taking a countermeasure against the rush current to suppress the malfunction is known. For example, a technique is known which suppresses increase of the rush current generated in supplying the power supply by arranging a plurality of switch cells 107 and separating timings of turning on the respective switch cells.

A circuit area of the controlled function block 101 and the number of controlled function blocks 101 in the semiconductor device 100 have been increasing according to a high integration of a chip. A large controlled function block 101 and many controlled function blocks 101 cause a large rush current. In the semiconductor device 100; when the large rush current is generated, the number of the switch cells 107 is increased. However, it is very difficult to reduce the power supply noise by appropriately controlling many switch cells 107.

SUMMARY

In an aspect of the present invention, a semiconductor device includes a first power supply line; a second power supply line; a first cell arrangement area in which a first cell is arranged; and a switch area in which a switching transistor and a decoupling capacitance are arranged. The first cell is provided in a first well of a first conductive type, the switching transistor is provided in a second well of the first conductive type, and the decoupling capacitance is provided in a separation area of a second conductive type to separate the first well and the second well from each other. The switching transistor connects the first power supply line and the second power supply line in response to a control signal, the first cell operates with power supplied from the second power supply line, and the decoupling capacitance is connected with the first power supply line.

In another aspect of the present invention, a semiconductor device includes a power supply line used to supply a power supply voltage; a ground line used to supply a ground voltage; a disconnection possible power supply line; a switch configured to supply the power supply voltage to the disconnection possible power supply line in response to a control signal; a first standard cell configured to operate based on the power supply voltage supplied from the disconnection possible power supply line; a second standard cell arranged between the power supply line and the ground line to operate without depending on the operation of the switch; and a capacitor provided near to the switch between the power supply line and the ground line. The capacitor supplies stored electric charge when the switch connects the power supply line and the disconnection possible power supply line.

In still another aspect of the present invention, a semiconductor device includes a first well of a first conductive type, wherein the first well has a switch configured to connect a basic power supply line and a disconnection possible power supply line; and a separation region configured to separate the first well from a second well of the first conductive type in which a standard cell operating with a voltage supplied from the disconnection possible power supply line is arranged. The separation region is of a second conductive type and has a decoupling capacitance connected between the basis power supply line and the ground line.

According to the present invention, the rush current can be suppressed without finely controlling the ON/OFF timings of the switching transistor, and thus a power supply noise can be reduced.

BRIEF DESCRIPTION OF THE DRAWINGS

The above and other objects, advantages and features of the present invention will be more apparent from the following description of certain embodiments taken in conjunction with the accompanying drawings, in which:

FIG. 9 is a cross sectional view showing the semiconductor device according to a third embodiment of the present invention.

DESCRIPTION OF THE PREFERRED EMBODIMENTS

Hereinafter, a semiconductor device of the present invention will be described in detail with reference to the attached drawings.

In embodiments mentioned below, the present invention is applied to a semiconductor device such as a gate array and a cell base IC. However, the semiconductor device to which the present invention is applied is not limited to the above mentioned example. In addition, the semiconductor device of the present invention can be used for a device required to suppress the increase of leakage current. Such a device generally has a standby state in which power supply to a non-operation portion is temporarily stopped, and a normal operation state in which a normal operation is performed.

Moreover, in the following description, it is assumed that a semiconductor device according to the present invention includes an NMOS transistor formed in a P well, and a PMOS transistor formed in an N well. The semiconductor device shifts from the normal operation state to the standby state by stopping power supply to a circuit region. It should be noted that this configuration does not limit the configuration of the semiconductor device to which the present invention is applied, and the present invention can be also applied to a case that a power supply control is performed to the whole of a macro region and a case that the power supply control is performed in units of function cells.

First Embodiment

Figure 3:
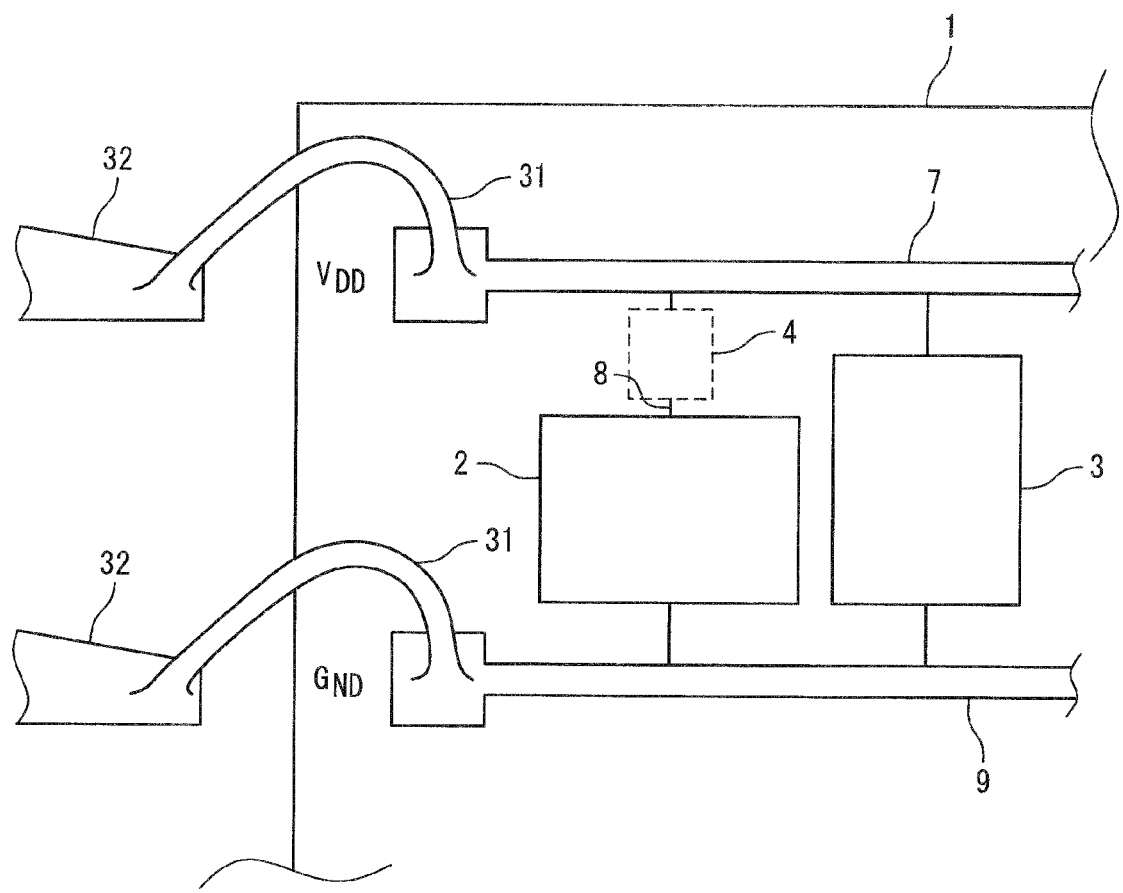
FIG. 3 is a diagram showing a configuration of a semiconductor device according to a first embodiment of the present invention.

FIG. 3 is a diagram showing an example of a configuration of a semiconductor device 1 according to a first embodiment of the present invention. The semiconductor device 1 includes a plurality of standard cells formed on a semiconductor substrate. The plurality of standard cells are arranged in array. A plurality of logic gates (transistor circuits) are mounted on each standard cell. These logic gates operate as a logic circuit by being connected to each other The semiconductor device 1 includes a macro region, and a function cell having the logic circuit is arranged in the macro region.

The semiconductor device 1 includes a portion in which power supply is stopped based on a predetermined condition (hereinafter, to be referred to as a controlled function block 2). The semiconductor device 1 includes at least one switch cell 4 formed on the semiconductor substrate. The controlled function block 2 switches the state between a standby state and a normal operation state in response to switching of the switch cell 4. A non-controlled function block 3 operates based on power supplied continuously without depending on the switching of the switch cell 4. The switch cell 4 controls a connection state between a power supply line 7 and a power supply line 8 in response to a control signal supplied from an external unit (not shown). The detailed configuration of the switch cell 4 will be described below.

In addition, the semiconductor device 1 is connected to a lead frame 32 via a bonding wire 31. The lead frame 32 is connected to a power supply IC (not shown) provided on the outside of the semiconductor device 1. A power supply voltage VDD is supplied from the power supply IC to the power supply line 7 of the semiconductor device 1. In addition, a ground voltage GND is connected from the power supply IC to a ground line 9 of the semiconductor device 1. The controlled function block 2 and the non-controlled function block 3 are provided between the power supply line 8 and the ground line 9. In addition, the switch cell 4 is provided between the power supply line 7 and the power supply line 8.

Figure 4:
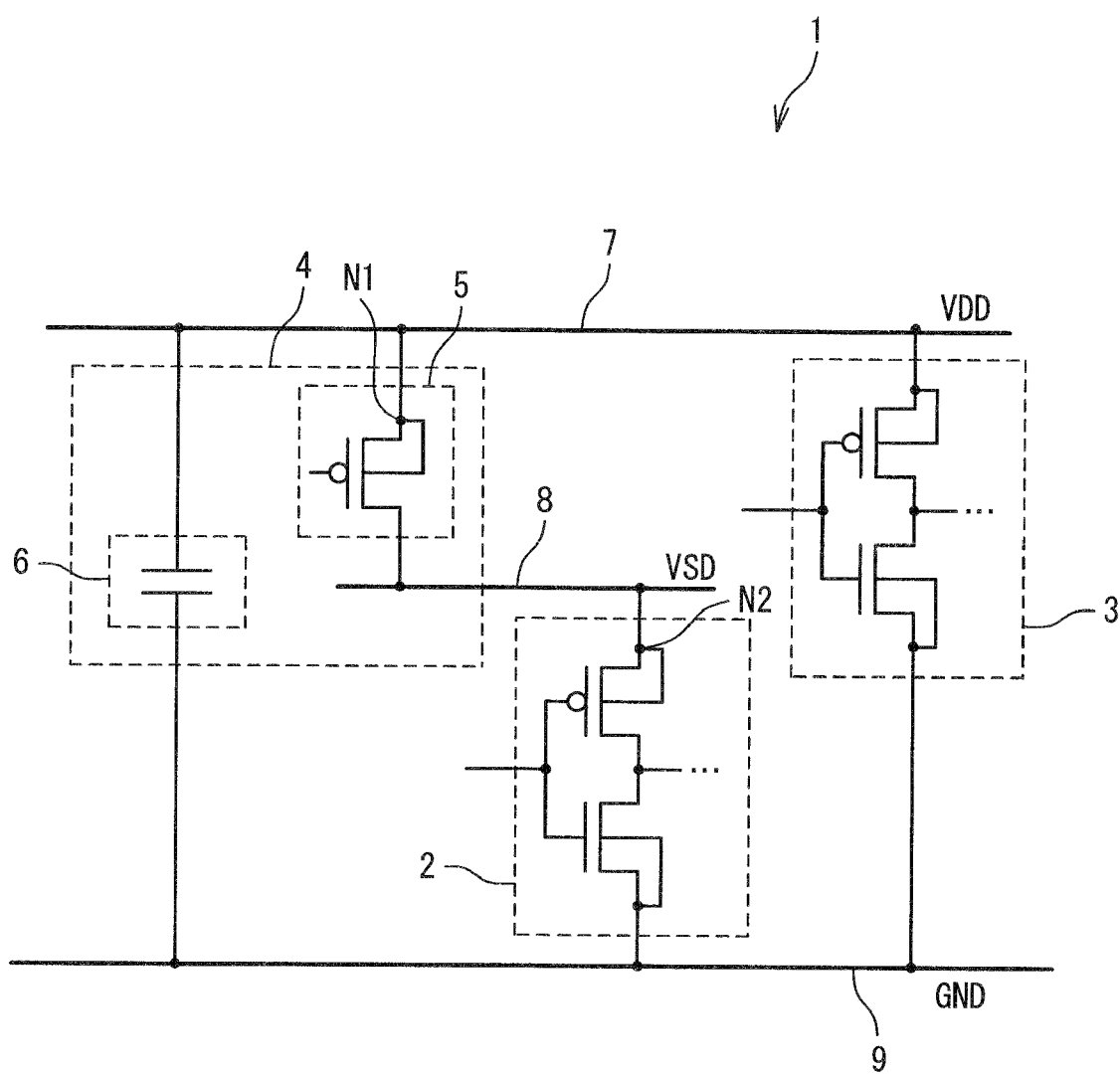
FIG. 4 is a circuit diagram showing the configuration of the semiconductor device in the first embodiment.

FIG. 4 is a circuit diagram showing an example of configuration of the semiconductor device 1 according to the present embodiment. The switch cell 4 includes a switching transistor 5 and a decoupling capacitance 6. Further, the semiconductor device 1 includes the power supply line 8. The switching transistor 5 of the switch cell 4 is provided between the power supply line 7 and the power supply line 8. The power supply line 8 supplies the power supply voltage VDD supplied via the switching transistor 5 to the controlled function block 2 as a power supply voltage VSD. The decoupling capacitance 6 of the switch cell 4 is provided between the power supply line 7 and the ground line 9. As shown in FIG. 4, a back gate of the PMOS transistor of the switching transistor 5 is connected to the power supply line 7 via a first node N1. In addition, a back gate of the PMOS transistor included in the controlled function block 2 is connected to the power supply line 8 via a second node N2.

Figure 5:
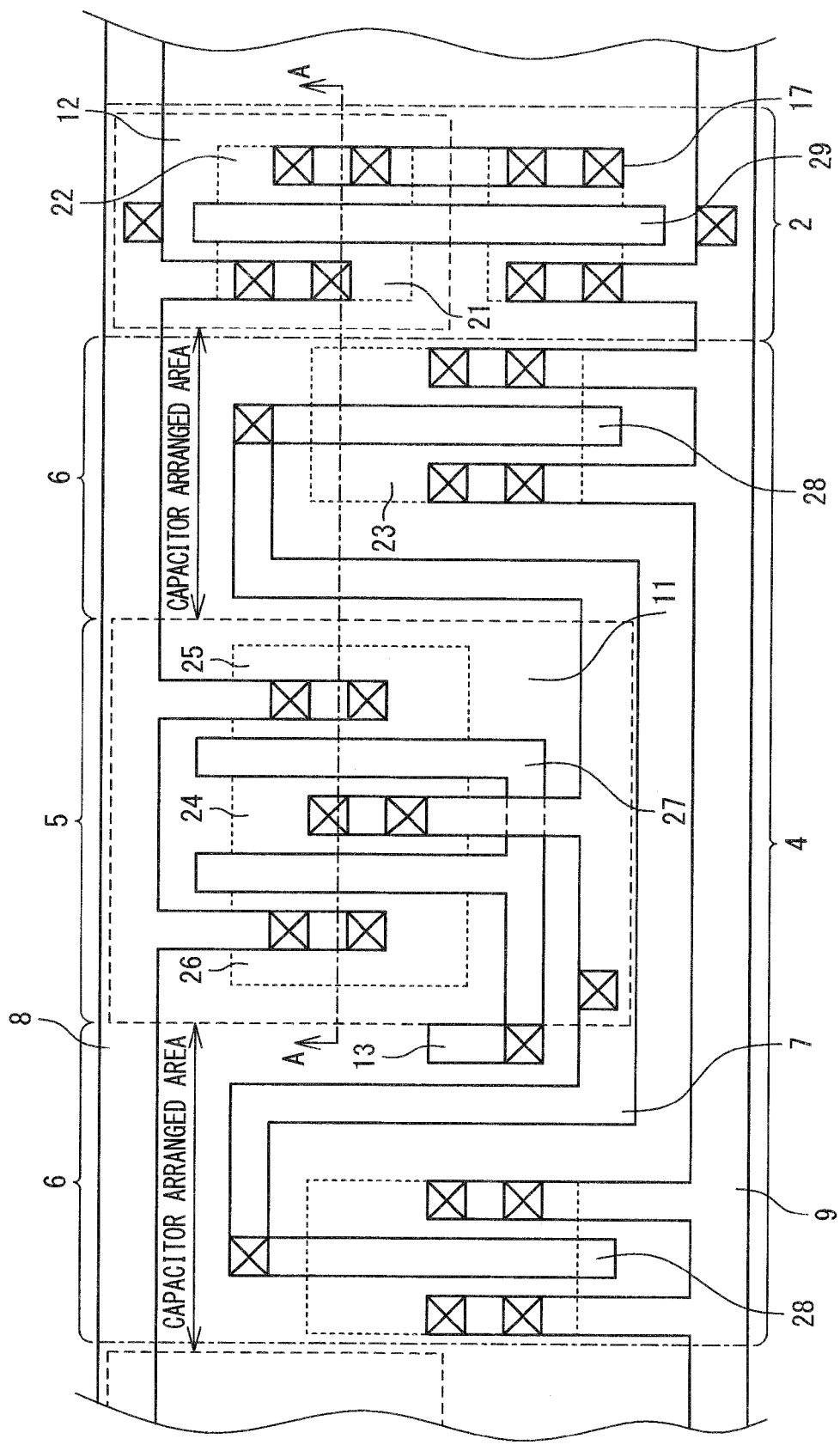
FIG. 5 is a layout diagram showing the semiconductor device in the first embodiment.

FIG. 5 is a layout diagram showing an example of planar configuration of the semiconductor device 1 according to the present embodiment. The switch cell 4 according to the present embodiment includes the switching transistor 5 and the decoupling capacitance 6, which are provided in adjacent to each other. The switch cell 4 includes a first well 11, and the switching transistor 5 is provided in the first well 11. The switching transistor 5 in the present embodiment includes a first switching transistor and a second switching transistor. The first switching transistor includes a source diffusion layer 24, a drain diffusion layer 25, and a gate electrode 27 of the switching transistor. The second switching transistor includes the source diffusion layer 24, a drain diffusion layer 26, and the gate electrode 27 of the switching transistor. The gate electrode 27 of the switching transistor is connected to a control signal line 13. The switching transistor 5 is activated in response to a control signal supplied via the control signal line 13. Two switching transistors are employed in this example, however, the number of the transistors may be increased when the transistors are laterally arranged.

The power supply voltage VDD is applied to the first well 11 via the power supply line 7. The first well 11 functions as the back gate of the first switching transistor. In addition, the first well 11 functions as a back gate of the second switching transistor. The power supply voltage VDD is continuously applied to the first well 11.

The controlled function block 2 includes a second well 12, and the PMOS transistor is configured in the second well 12. The PMOS transistor includes a CMOS gate electrode 29, a source diffusion layer 21, and a drain diffusion layer 22. The PMOS transistor in the controlled function block 2 is activated in response to a low level signal applied to the CMOS gate electrode 29. In addition, the NMOS transistor in the controlled function block 2 is activated in response to a high level signal applied to the CMOS gate electrode 29. The second well 12 functions as the back gate of the PMOS transistor in the controlled function block 2.

When the switching transistor 5 connects the power supply line 7 to the power supply line 8, the power supply voltage VDD is supplied to the second well 12 via the power supply line 8. When the switching transistor 5 disconnects the power supply line 8 from the power supply line 7, the second well 12 is set to a voltage different from a voltage of the first well 11. The switch cell 4 includes a semiconductor region of a conductivity type (hereinafter to be referred to as a capacitor arranged area) different from that of the first well 11 (or the second well 12) to electrically separate the first well 11 from the second well 12. The decoupling capacitance 6 in the present embodiment is arranged in the capacitor arranged area. The decoupling capacitance 6 is formed with an NMOS transistor whose source and drain are connected. A gate electrode 28 of the NMOS transistor is connected to the power supply line 7. In addition, the source and the drain of the NMOS transistor are connected to the ground line 9.

Figure 6:
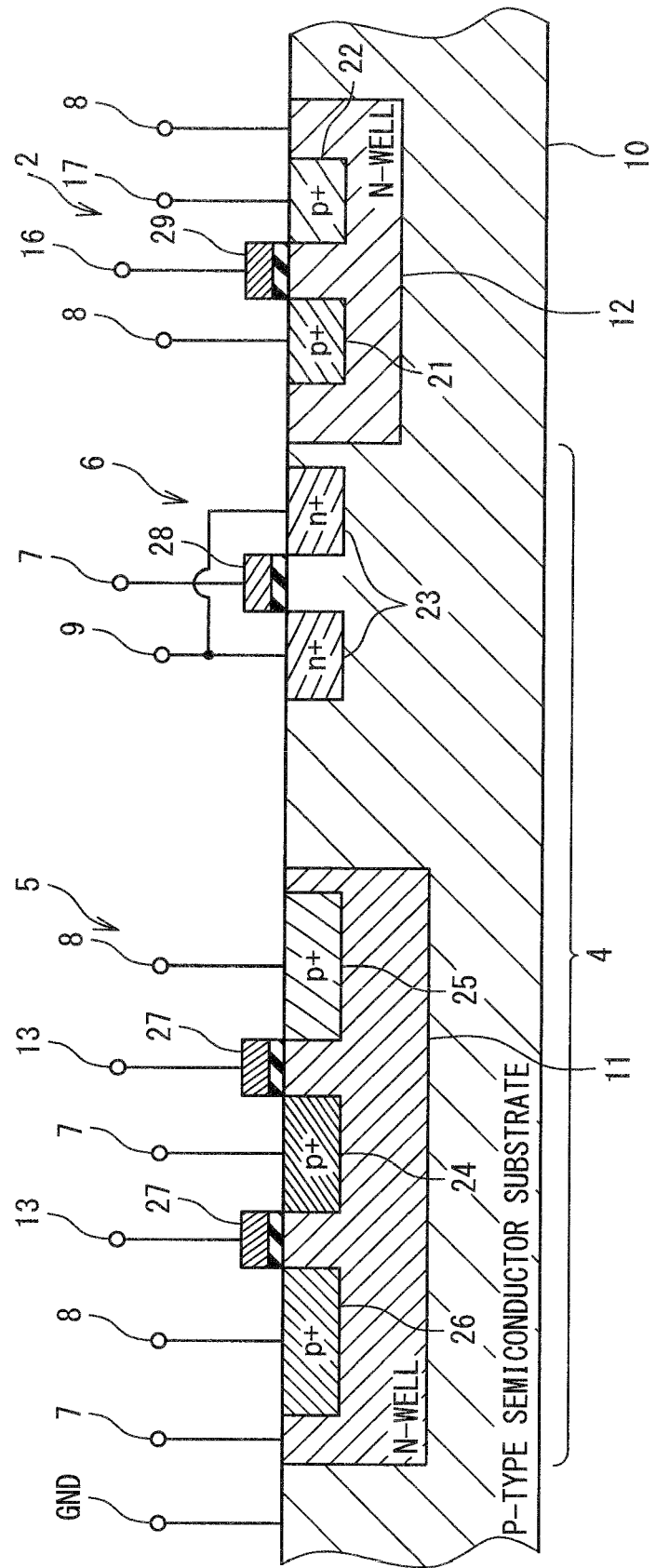
FIG. 6 is a cross sectional view showing the semiconductor device along the line A-A in FIG. 5.

FIG. 6 is a cross sectional view showing the semiconductor device along the line A-A shown in FIG. 5. Referring to FIG. 6, the first well 11 is formed on a substrate 10. In addition, the second well 12 is formed on the substrate 10. The first well 11 is electrically separated from the second well 12. As shown in FIG. 6, the decoupling capacitance 6 is arranged between the first well 11 and the second well 12. The decoupling capacitance 6 in the present embodiment includes N-type diffusion layers 23, a channel region between the N-type diffusion layers 23, a decoupling capacitance gate electrode 28, and a dielectric layer provided between the decoupling capacitance gate electrode 28 and the channel region.

The switching transistor 5 in the switch cell 4 is turned on in response to the control signal supplied from an external unit to connect the power supply line 7 to the power supply line 8. In this case, the power supply line 8 starts supply of the power supply voltage VSD to the controlled function block 2 in which supply of the power has been stopped. When the switching transistor 5 is turned on so that a current flowing from the power supply line 7 to the power supply line 8 is rapidly changed, there is a case that the power supplied from only a power supply IC provided for the outside of the semiconductor device 1 is not enough. The semiconductor device 1 according to the present embodiment includes the decoupling capacitance 6 in adjacent to the switching transistor 5. The decoupling capacitance 6 serves as a primary battery, and supplies power to the controlled function block 2 until the power supplied by the power supply IC is stabilized. This suppresses generation of power supply noise, and thus the non-controlled function block 3 can be prevented from malfunctions.

COMPARISON EXAMPLE

Figure 1:
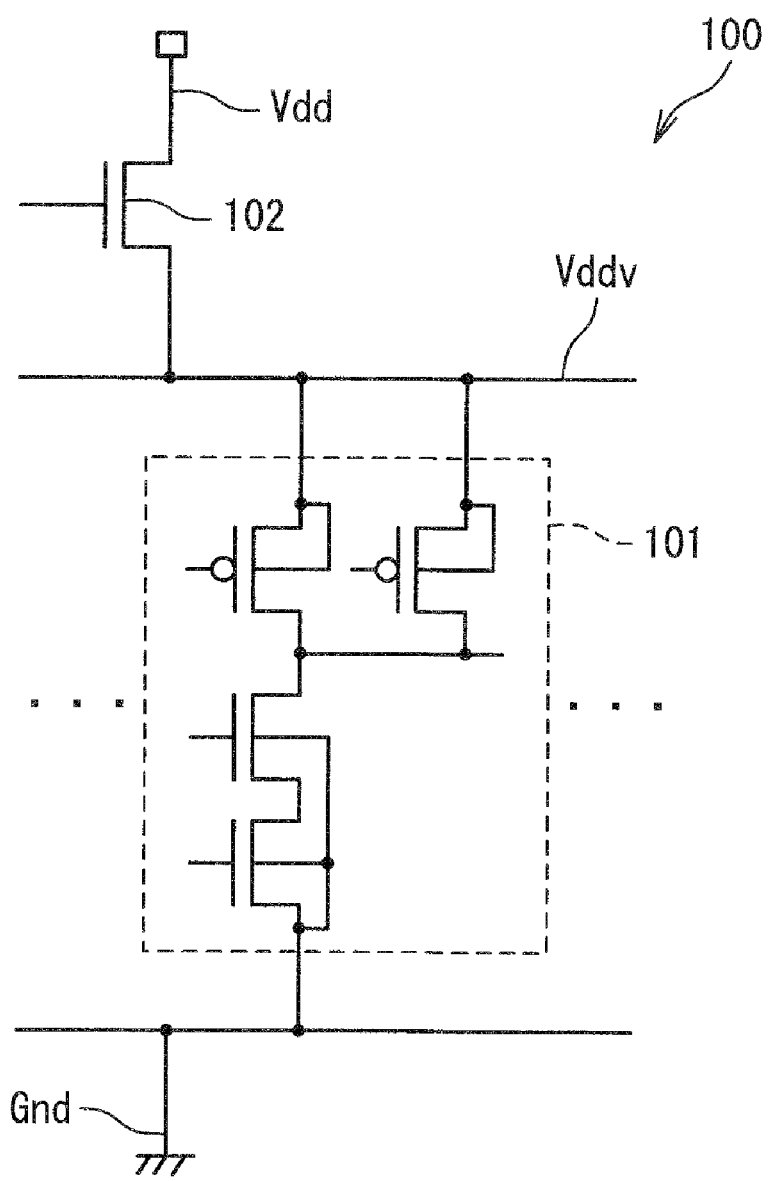
FIG. 1 is a circuit diagram showing a configuration of a conventional semiconductor device.
Figure 2:
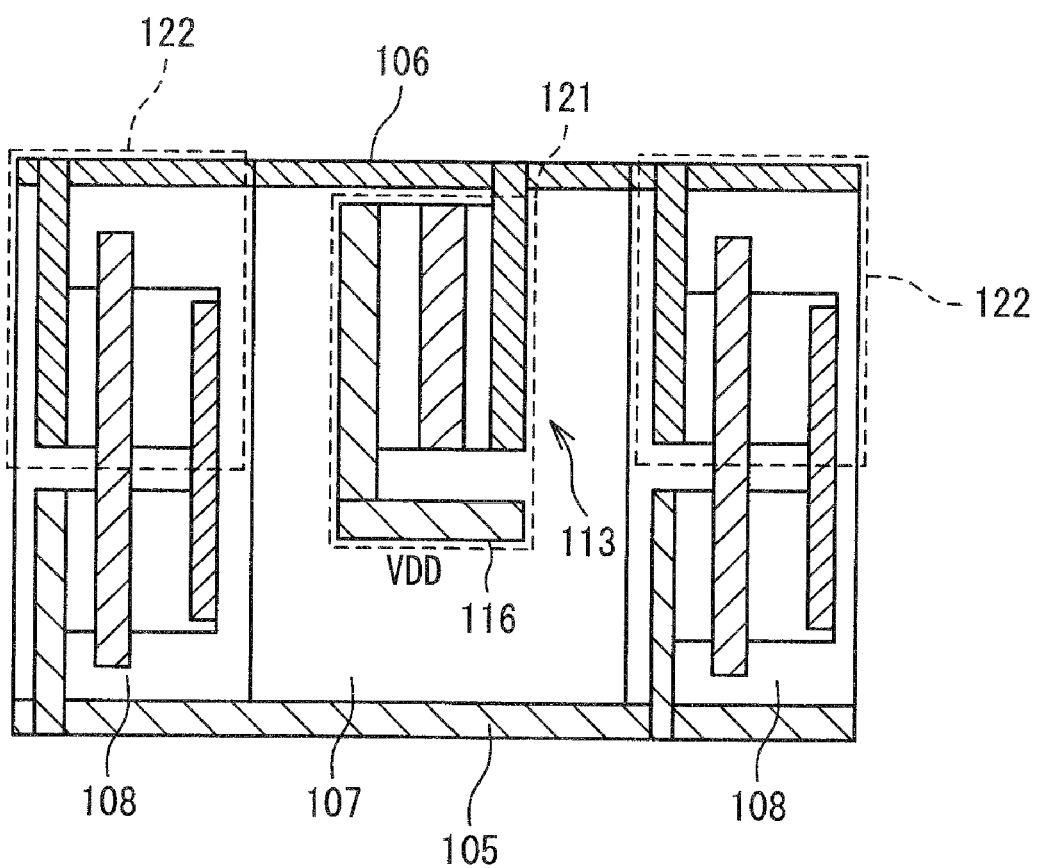
FIG. 2 is a layout diagram showing a power supply switch and a controlled function block in the conventional semiconductor device.
Figure 7:
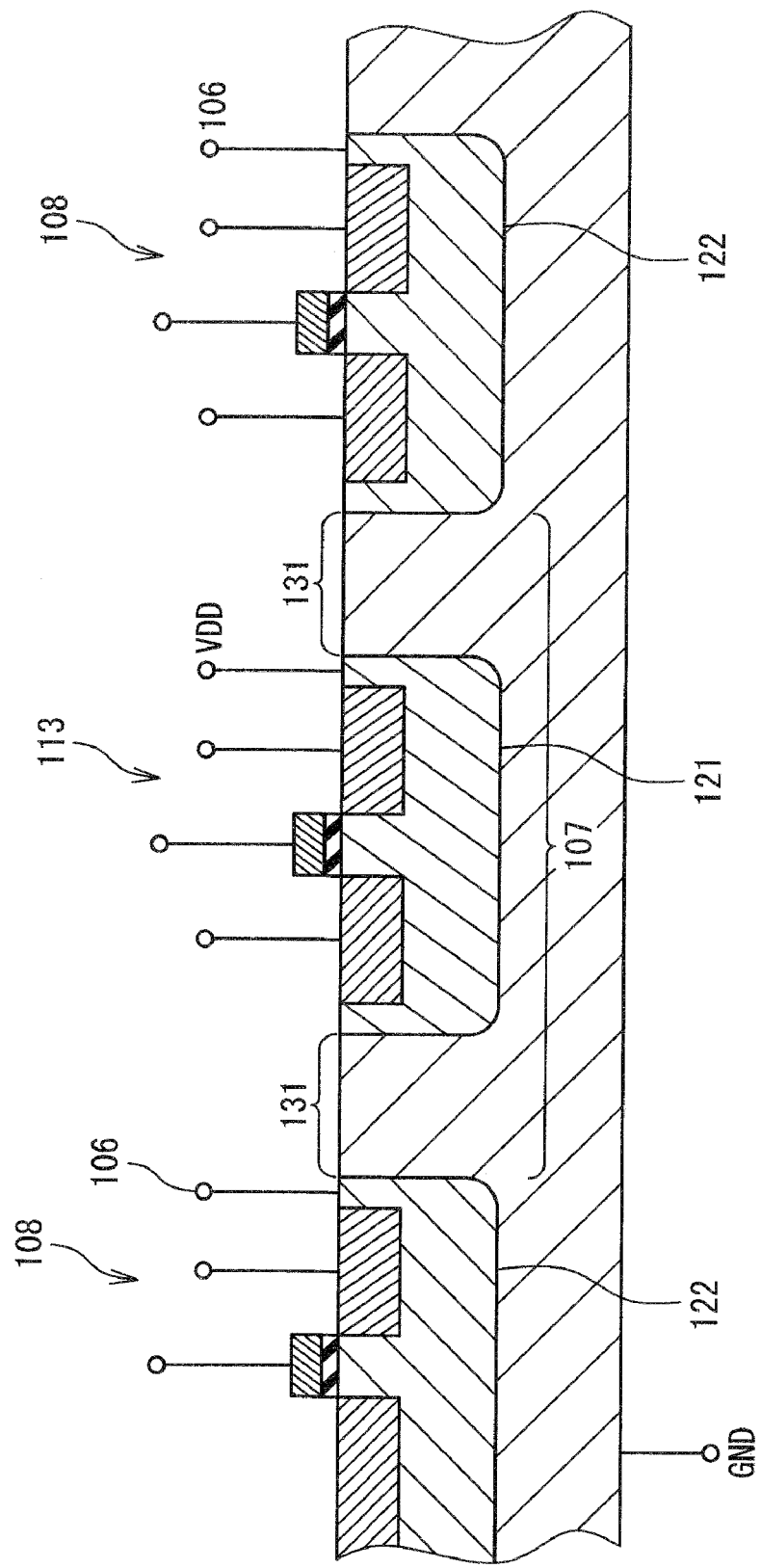
FIG. 7 is a cross sectional view showing a semiconductor device of a comparison example.

FIG. 7 is a cross sectional view showing the semiconductor device 100 shown in FIG. 2. A switch cell of the semiconductor device 100 includes a switching transistor 113. The switching transistor 113 is provided in a first well 121, and a function cell 108 is provided in a second well 122. A same voltage as the power supply voltage VDD is supplied to the first well 121. The second well 122 is connected to a sub power supply line 106.

The switch cell includes separation regions 131. The separation region 131 is provided to separate the first well 121 from the second well 122. The separation region 131 has a predetermined area for the separation between the wells. When the supply of power to the function cell 108 is stopped, a separation region 131 suppresses a current flowing from the second well 122 to the sub power supply line 106. That is to say, the first well 121 and the second well 122 are electrically isolated from each other by the separation region 131.

Returning to FIG. 6 again, the decoupling capacitance 6 is arranged in the capacitor arranged area of the switch cell 4 according to the present embodiment. The capacitor arranged area corresponds to the separation region 131, and separates the first well 11 from the second well 12. The switch cell 4 according to the present embodiment is provided with the decoupling capacitance 6 by efficiently using a chip area corresponding to the separation region 131 as the capacitor arranged area. According to this, the decoupling capacitance 6 can be arranged in the vicinity of or in adjacent to the switching transistor without consuming a cell arranged area. A power can be supplied from the decoupling capacitance 6 at the same time as the switch is turned on, by arranging the decoupling capacitance 6 near the switch for changing a current, and the electric charge can be supplied more efficiently than in case of newly arranging a capacitance cell.

In the above-described embodiment, a case of the NMOS transistor whose source and drain are connected to each other for the decoupling capacitance 6 has been described. When polarities of N-type and P-type are inverted in the semiconductor device 1 according to the present embodiment, a same effect can be obtained. That is to say, the switching transistor 5 is an NMOS transistor, the first well 11 and the second well 12 are P wells, and the substrate 10 is an N-type semiconductor substrate. In addition, the decoupling capacitance 6 includes a PMOS transistor. In accordance with this, in FIG. 6, the source diffusion layer 21, the drain diffusion layer 22, the source diffusion layer 24, and the drain diffusion layers 25 and 26 are N$^+$-type diffusion layers.

Second Embodiment

Figure 8:
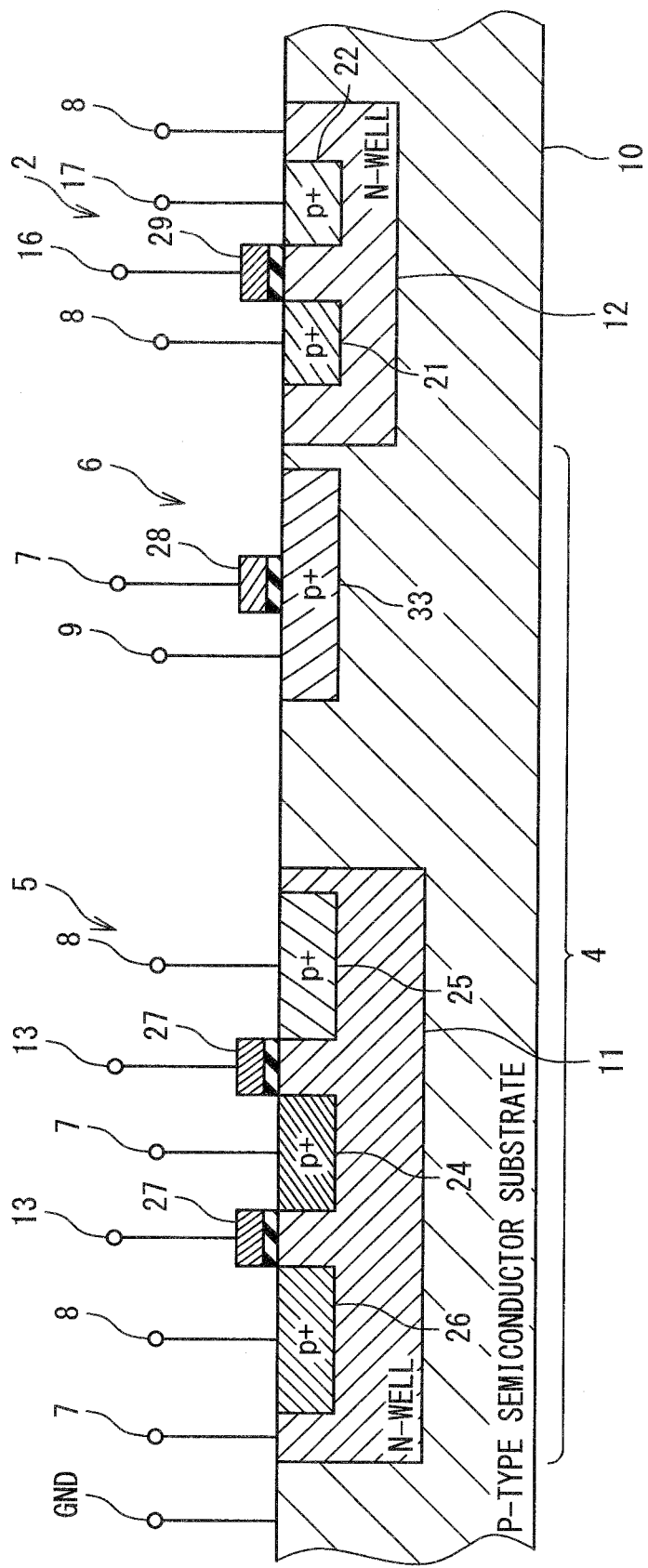
FIG. 8 is a cross sectional view showing the semiconductor device according to a second embodiment of the present invention.

FIG. 8 is a cross sectional view showing the semiconductor device 1 according to a second embodiment of the present invention. In the semiconductor device 1 according to the second embodiment, the decoupling capacitance 6 is replaced by a MOS capacitor. Referring to FIG. 8, the MOS capacitor has a structure in which a gate oxide film and a gate electrode are deposited on a P-type diffusion layer 33 in order. By forming the semiconductor device 1 in this manner, the decoupling capacitance 6 can be arranged in the vicinity of the switching transistor 5 without consuming a cell arrangement area.

Third Embodiment

FIG. 9 is a cross sectional view showing the semiconductor device 1 according to a third embodiment of the present invention. In the semiconductor device 1 according to the third embodiment, the decoupling capacitance 6 is replaced by a MOS capacitor. The MOS capacitor has a structure in which a gate oxide film and a gate electrode are deposited on an N-type diffusion layer 34 in order. By forming the semiconductor device 1 in this manner, the decoupling capacitance 6 can be arranged in the vicinity of the switching transistor 5 without consuming a cell arrangement area.

The above-mentioned embodiments may be combined within a scope in which their configurations and operations do not contradict with each other. In addition, when polarities of N-type and P-type are inverted in the above-mentioned embodiments, the same effect can be obtained. In the semiconductor device 1 according to the present invention, the decoupling capacitance 6 is not limited to the MOO capacitor. When the decoupling capacitance 6 is a MIM capacitor, the semiconductor device 1 including the decoupling capacitance 6 can sufficiently achieve an effect of the present invention.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor device comprising:
    a first power supply line;
    a second power supply line;
    a first cell arrangement area in which a first cell is arranged; and
    a switch area in which a switching transistor and a decoupling capacitance are arranged,
    wherein said first cell is provided in a first well of a first conductive type,
    said switching transistor is provided in a second well of the first conductive type,
    said decoupling capacitance is provided in a separation area of a second conductive type to separate said first well and said second well from each other,
    said switching transistor connects said first power supply line and said second power supply line in response to a control signal,
    said first cell operates with power supplied from said second power supply line, and
    said decoupling capacitance is connected with said first power supply line.

2. The semiconductor device according to claim 1, wherein said first well is adjacent to said separation area through a PN junction, and
    said second well is adjacent to said separation area through the PN junction.

3. The semiconductor device according to claim 2, further comprising a third power supply line,
    wherein said first power supply line supplies a power supply voltage,
    said third power supply line supplies a ground voltage,
    said second power supply line supplies said power supply voltage supplied through said switching transistor, to said first cell arrangement area, and
    said decoupling capacitance is connected with said first power supply line and said third power supply line.

4. The semiconductor device according to claim 3, further comprising:
    a second cell arrangement area arranged between said first power supply line and said third power supply line,
    wherein a second cell is provided in said second cell arrangement area to operate without depending on an operation of said switching transistor.

5. The semiconductor device according to claim 4, wherein said decoupling capacitance comprises a MOS transistor whose source and drain are connected in common.

6. The semiconductor device according to claim 5, wherein said first well contains an N-type well, and said second well contains an N-type well,
    said separation area contains a P-type well, and
    said MOS transistor is an NMOS transistor arranged on said P-type well.

7. The semiconductor device according to claim 5, wherein said first well contains a P well, said second well contains a P well, and said separation area contains an N-type region, and
    said MOS transistor whose source and drain are connected is a PMOS transistor arranged on said n-type region.

8. The semiconductor device according to claim 4, wherein said decoupling capacitance comprises a MOS capacitor.

9. The semiconductor device according to claim 8, wherein said first well contains an N well, said second well contains an N well, and said separation area contains a P-type region, and
    said MOS capacitor is provided on a P-type diffusion region formed on said P-type region.

10. The semiconductor device according to claim 8, wherein said first well contains an N well, said second well contains an N well, and said separation area contains a P-type region, and
    said MOS capacitor is provided on an N-type diffusion region formed on said P-type region.

11. The semiconductor device according to claim 8, wherein said first well contains a P well, said second well contains a P well, and said separation region contains an N-type region, and
    said MOS capacitor is provided on an N-type diffusion region formed in said N-type region.

12. The semiconductor device according to claim 8, wherein said first well contains a P well, said second well contains a P well, and said separation area contains an N-type region, and
    said MOS capacitor is provided on a P-type diffusion region formed in said N-type region.

13. A semiconductor device comprising:
    a first well of a first conductive type, wherein said first well has a switch configured to connect a basic power supply line and a disconnection possible power supply line; and
    a separation region configured to separate said first well from a second well of the first conductive type in which a standard cell operating with a voltage supplied from said disconnection possible power supply line is arranged,
    wherein said separation region is of a second conductive type and has a decoupling capacitance connected between said basic power supply line and a ground line.

* * * * *